United States Patent
Wirths et al.

(10) Patent No.: US 12,513,978 B2
(45) Date of Patent: Dec. 30, 2025

(54) MANUFACTURING METHOD FOR A POWER SEMICONDUCTOR DEVICE AND POWER SEMICONDUCTOR DEVICE

(71) Applicant: Hitachi Energy Ltd, Zürich (CH)

(72) Inventors: Stephan Wirths, Thalwil (CH); Lars Knoll, Hägglingen (CH)

(73) Assignee: HITACHI ENERGY LTD, Zürich (CH)

( * ) Notice: Subject to any disclaimer, the term of this patent is extended or adjusted under 35 U.S.C. 154(b) by 0 days.

(21) Appl. No.: 19/119,588

(22) PCT Filed: Oct. 10, 2022

(86) PCT No.: PCT/EP2022/078110
§ 371 (c)(1),
(2) Date: Apr. 9, 2025

(87) PCT Pub. No.: WO2024/078688
PCT Pub. Date: Apr. 18, 2024

(65) Prior Publication Data
US 2025/0261443 A1   Aug. 14, 2025

(51) Int. Cl.
*H10D 84/83* (2025.01)
*H02M 7/5387* (2007.01)
(Continued)

(52) U.S. Cl.
CPC ...... *H10D 84/8311* (2025.01); *H02M 7/5387* (2013.01); *H10D 30/019* (2025.01);
(Continued)

(58) Field of Classification Search
CPC .... H10D 30/66; H10D 64/513; H10D 84/016; H10D 84/83–8316; H10D 30/43;
(Continued)

(56) References Cited

U.S. PATENT DOCUMENTS

| | | |
|---|---|---|
| 9,385,195 B1 | 7/2016 | Zhang |
| 2003/0186475 A1 | 10/2003 | Ueda et al. |

(Continued)

FOREIGN PATENT DOCUMENTS

| | | | |
|---|---|---|---|
| CN | 112331553 A | * | 2/2021 |
| JP | 2010503981 A | | 2/2010 |

(Continued)

OTHER PUBLICATIONS

IPEA/EPO, International Preliminary Report on Patentability issued in PCT/EP2022/078110, mailed Jan. 20, 2025, 23 pages.

(Continued)

*Primary Examiner* — Britt D Hanley
*Assistant Examiner* — Jason James Greaving
(74) *Attorney, Agent, or Firm* — Procopio, Cory, Hargreaves & Savitch LLP (57) ABSTRACT

The present disclosure relates to a manufacturing method for a power semiconductor device (1, 40), comprising: forming multiple growth templates on a carrier substrate (2), comprising at least a first plurality of hollow growth templates (18) and a second plurality of hollow growth templates (28); selectively growing a first sequence of differently doped wide bandgap semiconductor materials in each one of the first hollow growth templates (18), thereby forming a corresponding plurality of first semiconductor structures (5) of a first type, in particular n+/p−/n−/n+ structures; and selectively growing a second sequence of differently doped wide bandgap semiconductor materials in each one of the second hollow growth templates (28), thereby forming a corresponding plurality of second semiconductor structures (6) of a second type, in particular n+/n−/p−/n+ structures. The disclosure further relates to a power semiconductor device (1, 40) comprising a carrier substrate (2), at least one dielectric layer (4, 27, 31), a plurality of first semiconductor (Continued)

structures (5) of a first type, and a plurality of second semiconductor structures (6) of a second type formed within the at least one dielectric layer (4, 27, 31).

14 Claims, 9 Drawing Sheets

(51) Int. Cl.
    *H10D 30/00* (2025.01)
    *H10D 30/01* (2025.01)
    *H10D 30/63* (2025.01)
    *H10D 30/66* (2025.01)
    *H10D 62/10* (2025.01)
    *H10D 62/832* (2025.01)
    *H10D 64/27* (2025.01)
    *H10D 84/01* (2025.01)

(52) U.S. Cl.
    CPC ....... *H10D 30/0297* (2025.01); *H10D 30/501* (2025.01); *H10D 30/635* (2025.01); *H10D 30/66* (2025.01); *H10D 62/122* (2025.01); *H10D 62/8325* (2025.01); *H10D 64/513* (2025.01); *H10D 84/0128* (2025.01); *H10D 84/0144* (2025.01); *H10D 84/016* (2025.01); *H10D 84/832* (2025.01); *H10D 84/839* (2025.01); *H10D 84/8316* (2025.01)

(58) Field of Classification Search
    CPC ............. H10D 30/014; H10D 30/6757; H10D 30/63–635; H10D 30/025; H10D 30/0291–0297; H10D 84/837–839; H01L 21/02639
    See application file for complete search history.

(56) References Cited

U.S. PATENT DOCUMENTS

| | | |
|---|---|---|
| 2004/0144301 A1 | 7/2004 | Neudeck et al. |
| 2004/0157353 A1* | 8/2004 | Ouyang et al. |
| 2010/0176459 A1* | 7/2010 | Wernersson et al. |
| 2011/0140072 A1 | 6/2011 | Varangis et al. |
| 2013/0161756 A1 | 6/2013 | Glass et al. |
| 2016/0233245 A1* | 8/2016 | Hashemi et al. |
| 2016/0268168 A1* | 9/2016 | Colinge et al. |
| 2016/0351391 A1 | 12/2016 | Borg et al. |
| 2018/0083068 A1 | 3/2018 | Okamoto et al. |
| 2022/0173227 A1* | 6/2022 | Islam ................... H10D 62/151 |

FOREIGN PATENT DOCUMENTS

| | | |
|---|---|---|
| JP | 2019067974 A | 4/2019 |
| WO | WO 2022136278 A2 * | 6/2022 |

OTHER PUBLICATIONS

Svensson et al., "III-V Nanowire Complementary Metal-Oxide Semiconductor Transistors Monolithically Integrated on Si", Nano Letters, vol. 15, No. 12, pp. 7898-7904; Dec. 9, 2015; XP055295020.

* cited by examiner

MANUFACTURING METHOD FOR A POWER SEMICONDUCTOR DEVICE AND POWER SEMICONDUCTOR DEVICE

CROSS-REFERENCE TO RELATED APPLICATIONS

The present application is a national stage entry of International Patent Application No. PCT/EP2022/078110, filed on 10 Oct. 2022, which is hereby incorporated herein by reference as if set forth in full.

The present disclosure generally relates to semiconductor devices and methods for their manufacturing, and in particular to a novel approach integrating at least two groups of different types of wide bandgap semiconductor structures into a single power semiconductor device.

Wide bandgap (WBG) semiconductor materials, such as silicon carbide (SiC), have advantageous properties, including a high critical electric field and electron mobility or high frequency switching. Accordingly, they yield a much larger Baliga figure-of-merit (BFOM) compared to commonly used semiconductor materials, such as silicon, making them a good option for power semiconductor device, such as power MISFETS. These advantages are enabling several applications for energy efficiency and electric transportation. However, the relatively high cost and processing complexity involved in manufacturing power semiconductor device comprising WBG materials limits their application in many fields.

Embodiments of the disclosure relate to a manufacturing method for a power semiconductor device comprising the steps of forming multiple hollow growth templates on a carrier substrate and selectively growing first and second sequences of differently doped WBG semiconductor material therein, as well as a power semiconductor device comprising a carrier substrate, a dielectric layer, and a plurality of first and second semiconductor structures formed therein.

According to a first aspect of the disclosure, a manufacturing method for a power semiconductor device is provided. The method comprises:
  forming multiple growth templates on a carrier substrate, comprising at least a first plurality of hollow growth templates and a second plurality of hollow growth templates;
  selectively growing a first sequence of differently doped WBG semiconductor material in each one of the first hollow growth templates, thereby forming a corresponding plurality of first semiconductor structures of a first type, in particular n+/p−/n−/n+ structures; and
  selectively growing a second sequence of differently doped WBG semiconductor material in each one of the second hollow growth templates, thereby forming a corresponding plurality of second semiconductor structures of a second type, in particular n+/n−/p−/n+ structures.

The above processing steps enable multiple groups of WBG semiconductor structures of different types to be grown on a common carrier structure. This enables, on the one hand, to efficiently produce multiple WBG semiconductor structures of the same type, e.g. for carrying large currents and/or high voltages within one branch of a circuit, and on the other hand, to implement different structures within a single integrated power device, e.g. for different branches of the circuit. For example, if the individual first and second semiconductor structures are respectively connected in parallel, they can carry a relatively high current. Moreover, if the plurality of first semiconductor structures of the first type and the plurality of second semiconductor structures of the second type are connected in sequence, they can form commonly occurring circuit components, such as a lower and upper half of a half-bridge. Moreover, by using WBG semiconductor material, which is selectively grown in the growth templates, a high critical electrical field and electron mobility can be achieved, improving, for example, energy efficiency and enabling high frequency switching.

In at least one implementation, an area of vertically oriented growth templates is formed, wherein each one of the vertically oriented growth templates extends in a direction perpendicular to a main surface of the carrier substrate. This enables the manufacturing of vertical power components, such as vertical MISFETs.

In at least one implementation, the step of forming multiple hollow growth templates may comprise: depositing and structuring a sacrificial material, in particular amorphous silicon, on the carrier substrate; covering the structured sacrificial material with a layer of dielectric material; and selectively removing the sacrificial material surrounded by the dielectric material to form the first and second plurality of growth templates. This enables the creation of multiple, very narrow, vertical growth templates using conventional semiconductor processing steps.

In at least one implementation, initially upper ends of the multiple growth templates are sealed, and the method further comprises the following steps: before growing the first sequence of differently doped WBG semiconductor material, opening only the upper ends of a first subset of the multiple growth templates; after growing the first sequence of differently doped WBG semiconductor materials, re-sealing the upper ends of the first subset; and before growing the second sequence of differently doped WBG semiconductor material, opening only the upper ends a second subset of the multiple growth templates. In this way, at least parts of the growth templates can be formed together, while different types of semiconductor structures can be grown at a later stage using conventional semiconductor processing equipment.

In at least one implementation, the first and second sequence of differently WBG semiconductor material is selectively grown by chemical vapor deposition (CVD) using different dopant profiles, allowing the use of conventional processing chambers, and alleviating the later implantation of dopants in a previously grown epilayer.

In at least one implementation, the method further comprises forming a plurality of first gate structures surrounding at least a part each one of the plurality of first semiconductor structures and/or forming a plurality of second gate structures surrounding at least a part each one of the plurality of second semiconductor structures. In this way, the first and/or second semiconductor structures can be switched, for example for implementing a half-bridge of an inverter circuit. Moreover, by completely surrounding the respective semiconductor structures, a particularly fast switching response can be achieved.

In at least one implementation, the method further comprises forming at least one dielectric layer, wherein the first gate contacts are buried in the at least one dielectric layer, and the second gate contacts are formed at or near an upper surface of the at least one dielectric layer. This enables, among others, to arrange the respective gate contacts in proximity to respective drift layers of the first and second semiconductor structures and vertically offset with respect to each other.

In at least one implementation, the method further comprises: forming a first top side contact, in particular a positive DC terminal of a half-bridge structure, electrically connected to at least a subgroup of the plurality of first semiconductor structures; forming a second top side contact, in particular a negative DC terminal of a half-bridge structure, electrically connected to at least a subgroup of the plurality of second semiconductor structures; and/or forming a bottom contact, in particular a AC terminal of a half-bridge structure, electrically connected to at least a subgroup of the plurality of first semiconductor structures and a subgroup of the plurality of second semiconductor structures. Such a connection arrangement enables the parallel connection of parts or all of the first and second semiconductor structures, respectively.

According to a second aspect of the disclosure, a power semiconductor device is provided. The device comprises:
- a carrier substrate comprising at least one bottom contact, in particular an AC terminal of a half-bridge structure;
- at least one dielectric layer formed on the carrier substrate;
- a plurality of first semiconductor structures of a first type, in particular n+/p−/n−/n+ structures, formed within the at least one dielectric layer, each one of the first semiconductor structures electrically connected to the bottom contact and comprising a first sequence of differently doped sublayers of a WBG semiconductor material;
- a plurality of second semiconductor structures of a second type, in particular n+/n−/p−/n+ structures, formed within the at least one dielectric layer, each one of the second semiconductor structures electrically connected to the bottom contact and comprising a second sequence of differently doped sublayers of the WBG semiconductor material;
- a first top side contact arranged on an upper surface of the at least one dielectric layer, in particular a positive DC terminal of a half-bridge structure, the first top side contact electrically connecting at least a subgroup of the plurality of first semiconductor structures; and
- a second top side contact arranged on the upper surface of the at least one dielectric layer, in particular a negative DC terminal of a half-bridge structure, the second top side contact electrically connecting at least a subgroup of the plurality of second semiconductor structures.

The power semiconductor device according to the second embodiment is useful for the monolithic integration of power semiconductor devices comprising a plurality of series and/or parallel connected semiconductor structures made from a WBG semiconductor material. It may be manufactured using the manufacturing method according to the first aspect and provides similar advantages and features as indicated above.

In at least one implementation, the first and second semiconductor structures are selectively grown nanowire structures having a diameter of 10 nm to 10 μm, and/or having a length of 1 μm to 100 μm. The at least one dielectric layer may have a thickness of 1 μm to 100 μm. Such semiconductor structures enable a high power density and hence the space efficient integration of power semiconductor devices. They are suitable for voltages and currents occurring in typical power applications, such as inverters for electrical vehicles and/or photovoltaic power generation.

In at least one implementation, the carrier substrate comprises a layer made from silicon or polycrystalline silicon carbide, the at least one dielectric layer comprises a dioxide, in particular silicon dioxide or aluminum oxide, and/or the WBG semiconductor material comprises silicon carbide, in particular one of 4H—SiC, 6H—SiC, or 3C—SiC. Among others, the above device structure and corresponding processing steps enable the combination of active semiconductor structures made from WBG semiconductor material on a carrier substrate made from relatively cheap semiconductor material, such as silicon or polycrystalline silicon carbide.

In at least one implementation, the device comprises a half-bridge circuit or a full bridge circuit. Such circuits are often used in different power applications, such as inverters, rectifiers and converters.

While the disclosure provides multiple aspects, every feature described with respect to the first aspect is also disclosed herein with respect to the second aspect, and vice versa, even if the respective feature is not explicitly mentioned in the context of the specific aspect.

The accompanying figures are included to provide a further understanding. In the figures, elements of the same structure and/or functionality may be referenced by the same reference signs. It is to be understood that the embodiments shown in the figures are illustrative representations and are not necessarily drawn to scale.

Figure 1:
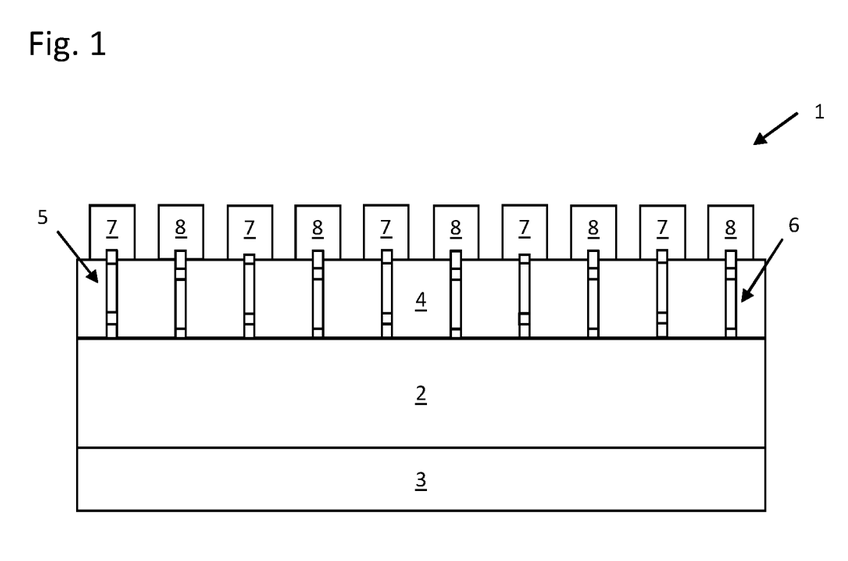
FIG. 1 shows a schematic cross-section through a power semiconductor device comprising two different types of semiconductor structures.

FIG. 1 shows a schematic cross-section through a power semiconductor device 1 according to the present disclosure.

Figure 2:
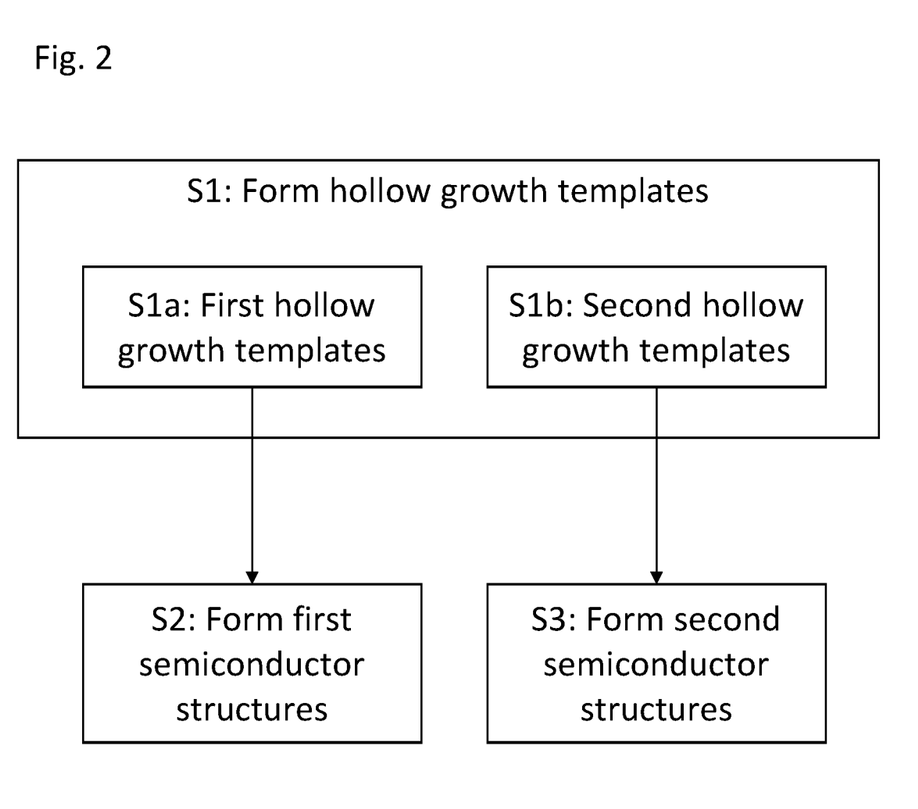
FIG. 2 shows, in a schematic manner, processing steps of a method for manufacturing a power semiconductor device.

The power semiconductor device 1 shown in FIG. 1 comprises a carrier substrate 2. The carrier substrate 2 may comprise, for example, parts of a silicon wafer and/or one or more epitaxially grown layers (epilayers or epitaxial layers) or amorphous silicon carbide (SiC). As shown in FIG. 2, a bottom contact 3 is formed on the lower main face of the carrier substrate 2. The bottom contact 3 may form a common terminal for all semiconductor structures formed on the carrier substrate 2.

On the opposite top surface of the carrier substrate 2, a dielectric layer 4 is formed. The dielectric layer 4 may be formed from an electrically insulating material, such as a dioxide, for example silicon dioxide ($SiO_2$) or aluminum oxide ($Al_2O_3$). Within the dielectric layer 4, a number of vertical semiconductor structures 5 and 6 are formed. In particular, in the embodiment shown in FIG. 1, a regular pattern of alternating first semiconductor structures 5 and second semiconductor structures 6 is formed.

The first semiconductor structures 5 and the second semiconductor structures 6 differ in their dopant profile and/or functionality. For example, as further detailed below, the first semiconductor structures 5 may form switching components of a lower leg of a half-bridge circuit, whereas the second semiconductor structures 6 may form switching components of an upper leg of the same half-bridge circuit.

In the embodiment shown in FIG. 1, a number of different top side contacts 7 and 8 are formed on an upper surface of the dielectric layer 4 for connecting the first semiconductor structures 5 and the second semiconductor structures 6. In particular, several first top side contacts 7 for connecting the first semiconductor structures 5 and several second top side contacts 8 for connecting the second semiconductor structures 6 are formed. Attention is drawn to the fact that, in the cross-section shown in FIG. 1, only a single semiconductor structure 5 or 6 is shown as being connected to the respective top side contacts 7 and 8. However, in practice further semiconductor structures of the same type may be present behind or in front of the row of semiconductor structures shown in the cross-section of FIG. 1. In this case, the respective top side contacts 7 and 8 will connect multiple or all of the first semiconductor structures 5 or second semiconductor structures 6 of the same type. Specifically, the two different top side contacts 7 and 8 may form positive and negative DC contacts of a half-bridge circuit, with the bottom contact 3 forming an AC contact.

FIG. 2 shows, in a schematic manner, a method for manufacturing a power semiconductor device, such as a power semiconductor device 1 of FIG. 1.

In a first step S1, a plurality of hollow growth templates is formed. This can be achieved, for example, by selective etching of a dielectric layer and/or the deposition of sacrificial material, which is later covered with a dielectric material as detailed below. As further indicated in FIG. 2, step S1 comprises, in a step S1a, the formation of first growth templates and, in a step S1b the formation of second growth templates. In practice, these two steps may be performed partially or completely at the same time. However, in other implementations, the first and second growth templates may be formed separately from each other.

In a second step S2, first semiconductor structures are formed in the first hollow growth templates formed in step S1a. For example, a first type of semiconductor structure, such as an n+/p−/n−/n+ structure may be formed by selective area epitaxy. This can be achieved, among others, by selectively growing, i.e. depositing, differently doped WBG semiconductor materials only inside the first hollow growth templates, whereas growth is inhibited in other areas covered by the material of the growth templates. The above notation of layers iterates the respective sublayers and grown WBG semiconductor materials in the order they are grown, i.e. from the substrate 2 upwards. That is to say, at first an n+ material is deposited, followed by a p-material, an n− material, and finally an n+ material.

In a third step S3, second semiconductor structures 6 are formed in the second hollow growth templates formed in step S1b. The second semiconductor structures 6 will differ in their physical setup, dopant profile and/or functionality from the first semiconductor structures 5 grown in step S2. For example, they may have an inverted dopant profile or sequence of sublayers. For example, n+/n−/p−/n+ WBG semiconductor structures may be grown in the second hollow growth templates.

It should be noted that, while the formation of two groups of growth templates and the formation of two types of semiconductor structures has been described above, more than two types of hollow growth templates and types of semiconductor structures may be formed in a similar manner.

The schematic diagram of FIG. 2 focuses on the formation of different first and second semiconductor structures 5 and 6, respectively. The formation of an actual power semiconductor devices may comprise a number of further processing steps, such as the formation of top and bottom contacts as well as gate electrodes. Such steps are described in greater detail below with respect to the manufacturing of a half-bridge structure comprising a plurality of vertical MISFETs.

Figure 3A:
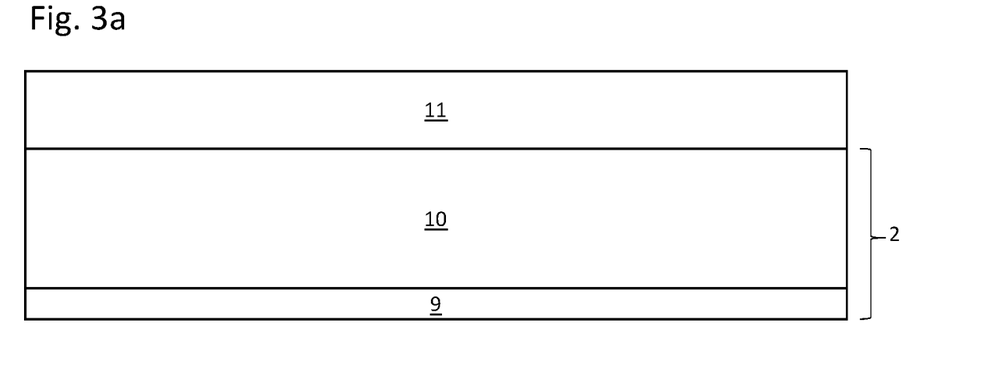
FIGS. 3a to 3r show various stages of manufacturing a power semiconductor device comprising a half-bridge circuit.
Figure 3B:
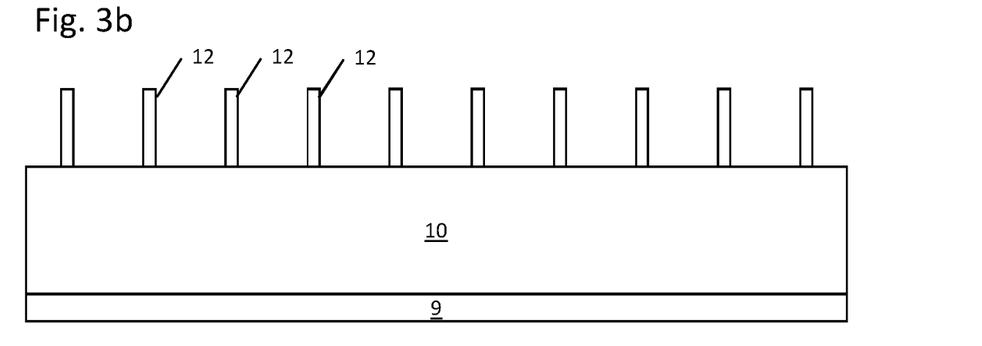
Figure 3C:
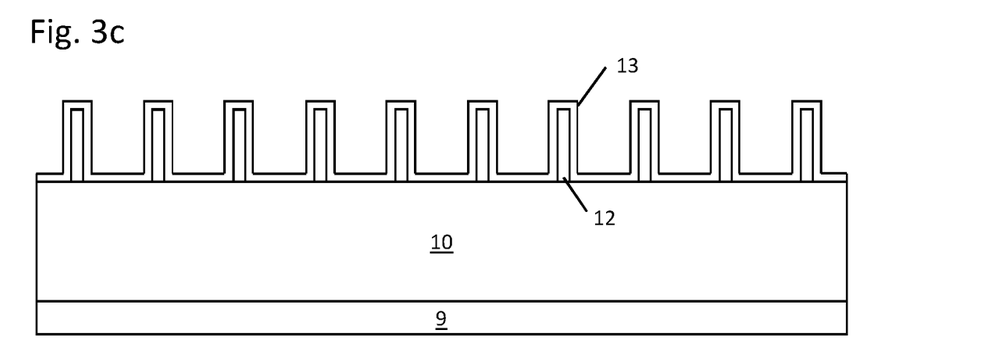
Figure 3D:
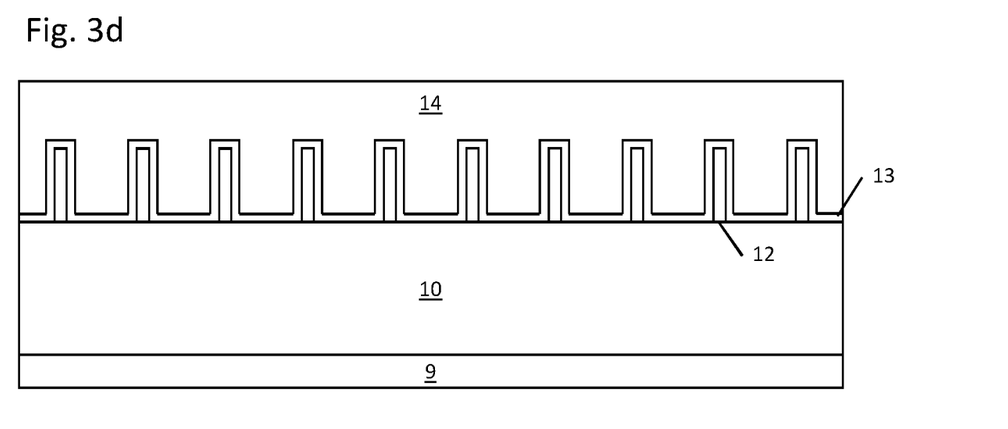
Figure 3E:
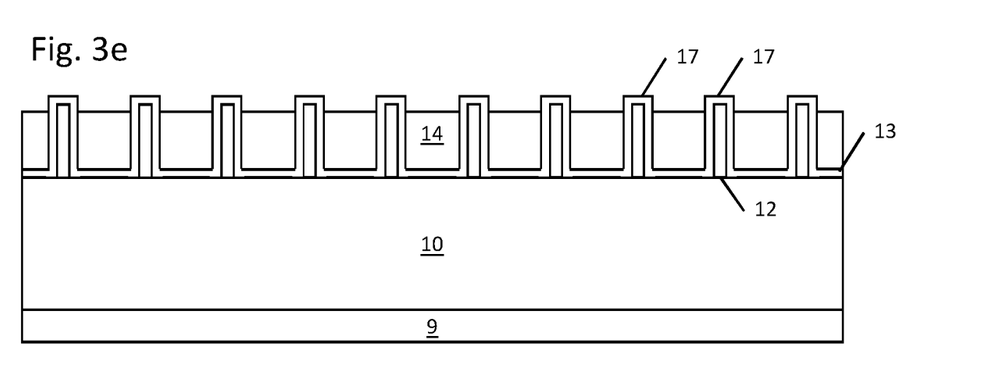
Figure 3F:
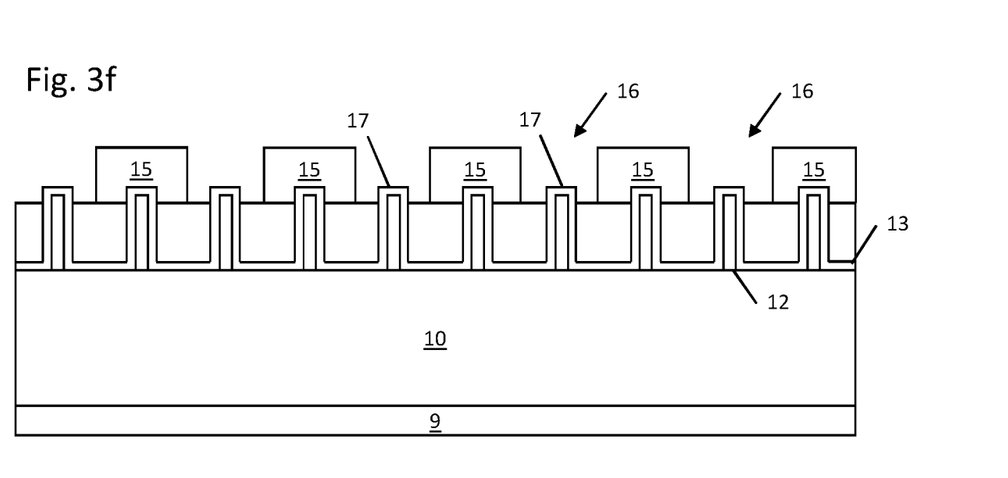
Figure 3G:
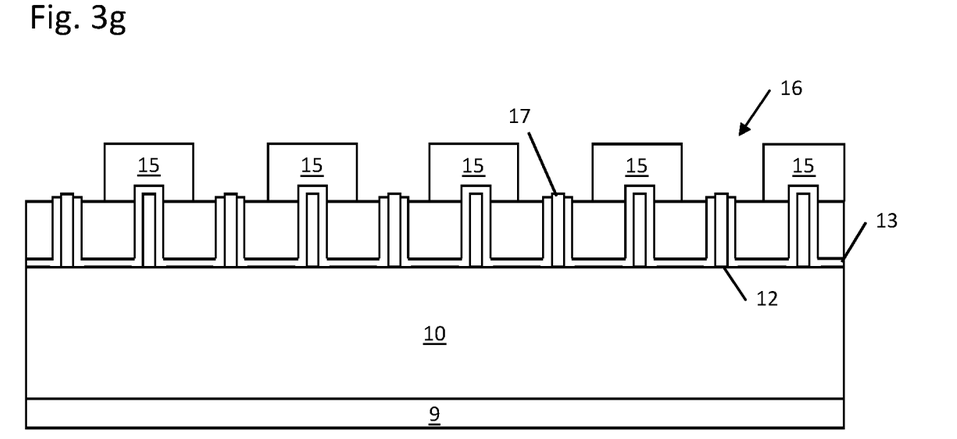
Figure 3H:
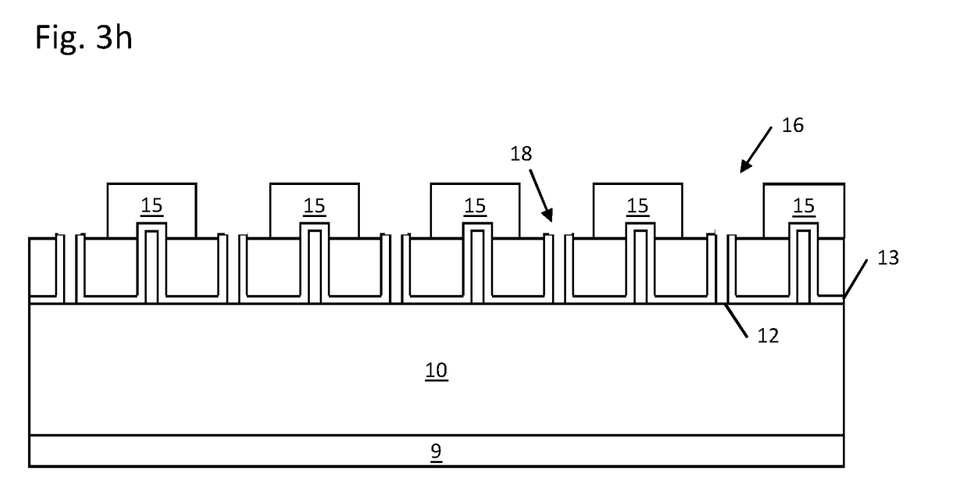
Figure 3I:
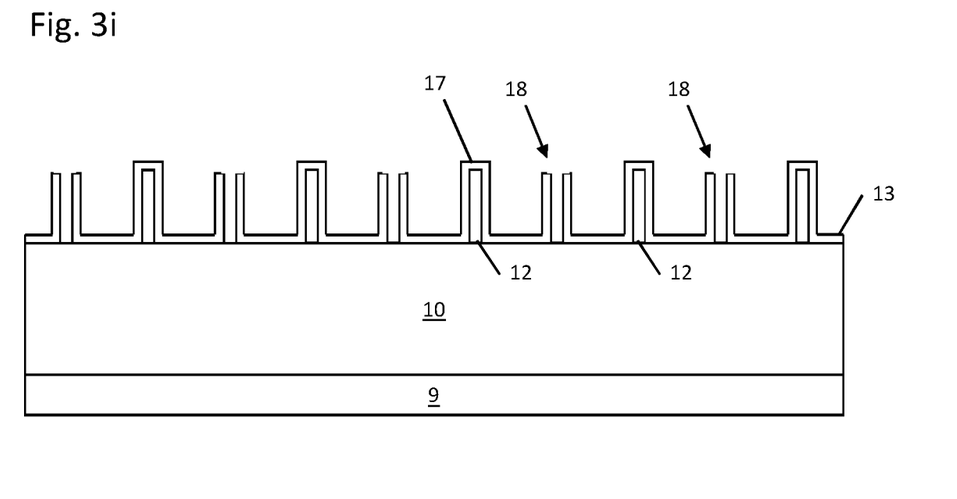
Figure 3J:
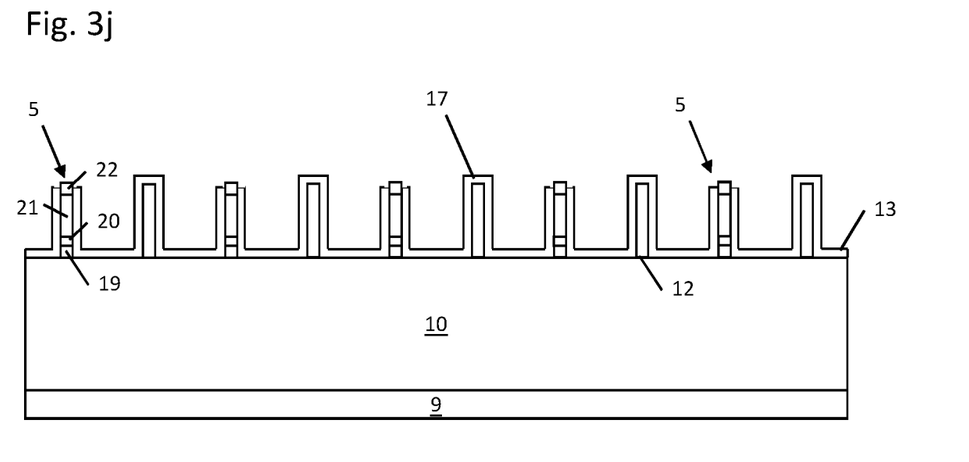
Figure 3K:
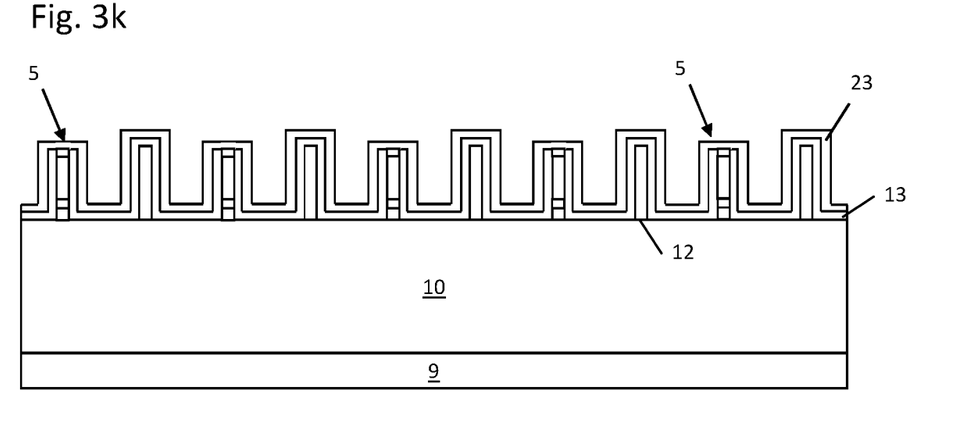
Figure 3L:
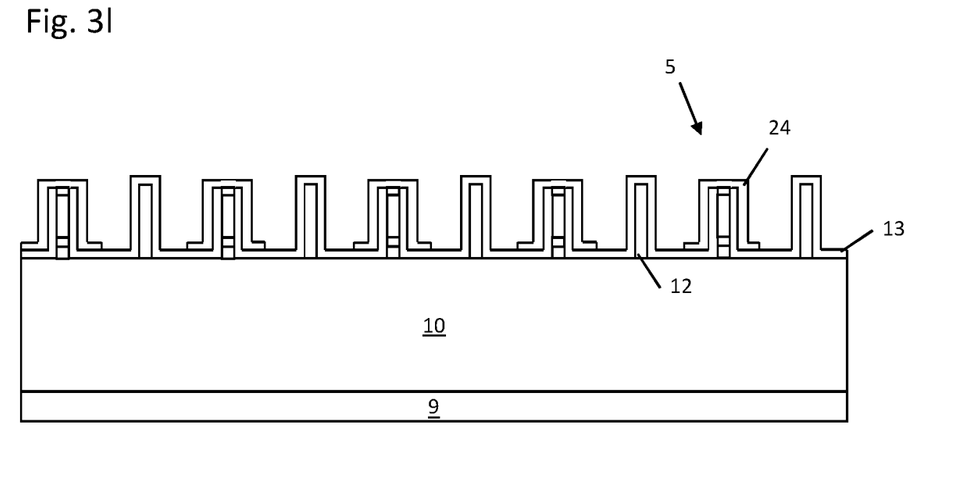
Figure 3M:
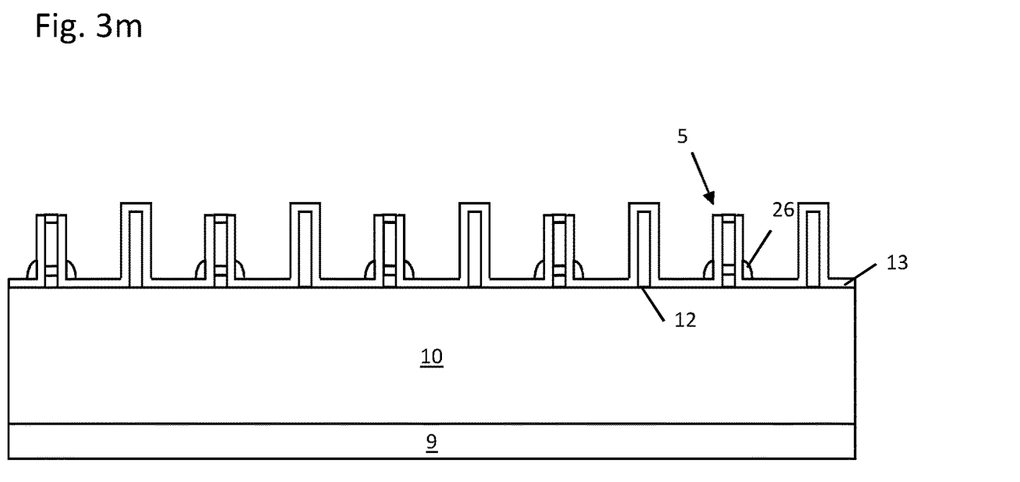
Figure 3N:
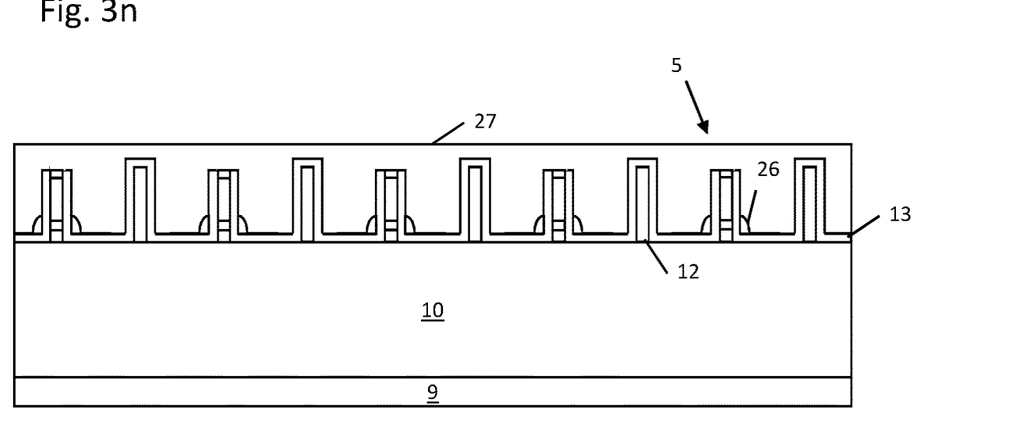
Figure 3O:
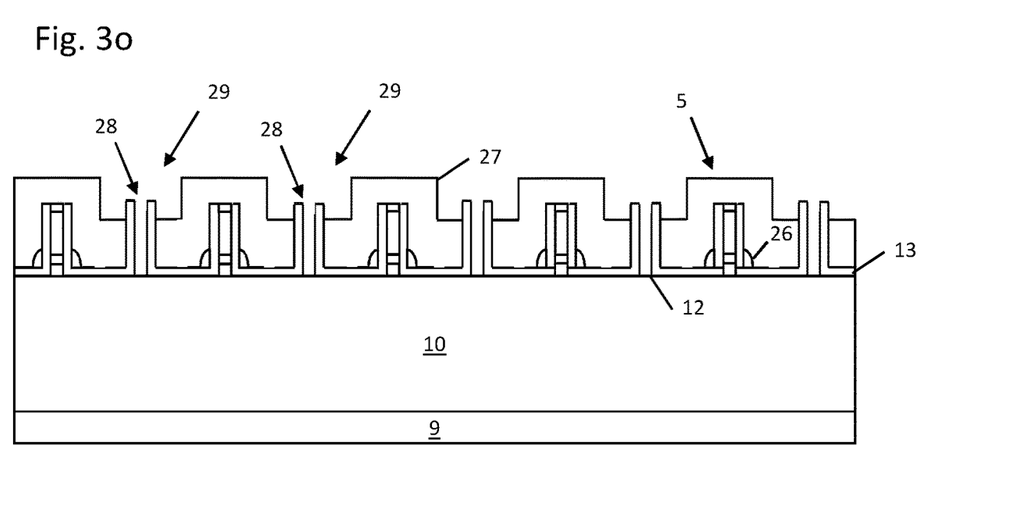
Figure 3P:
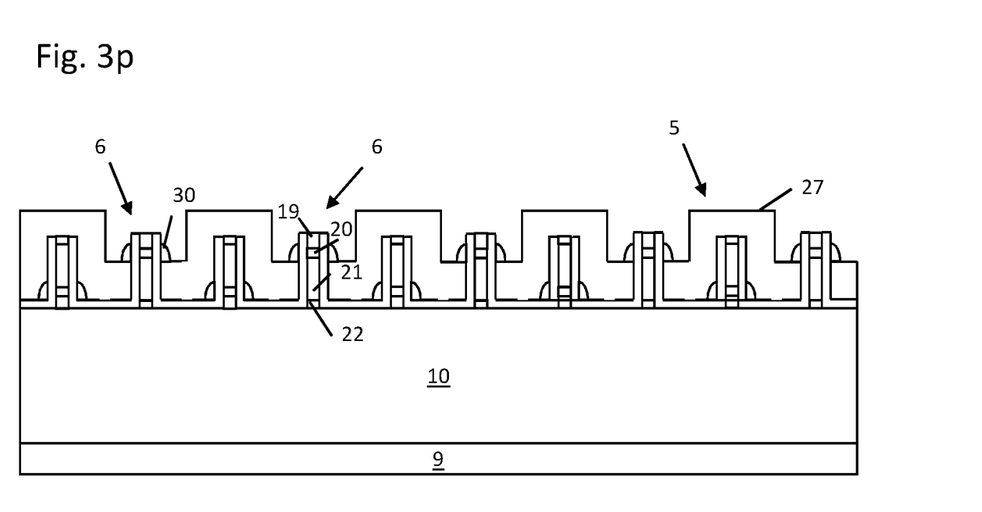
Figure 3Q:
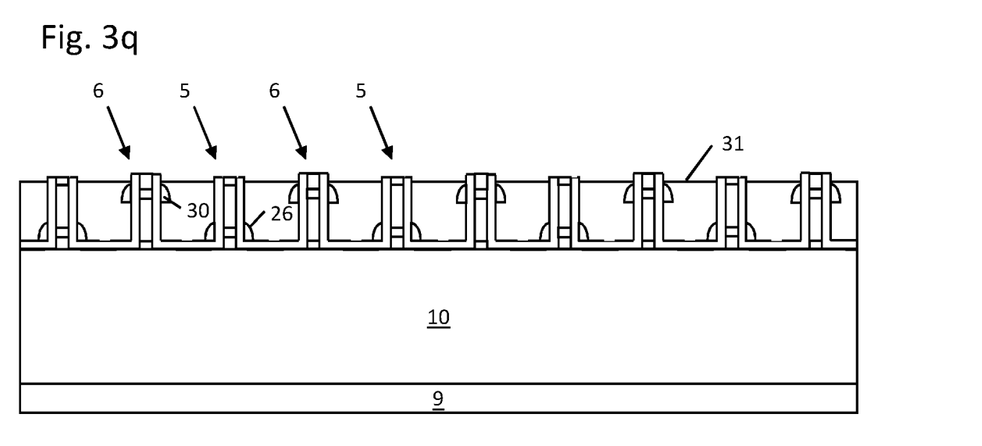
Figure 3R:
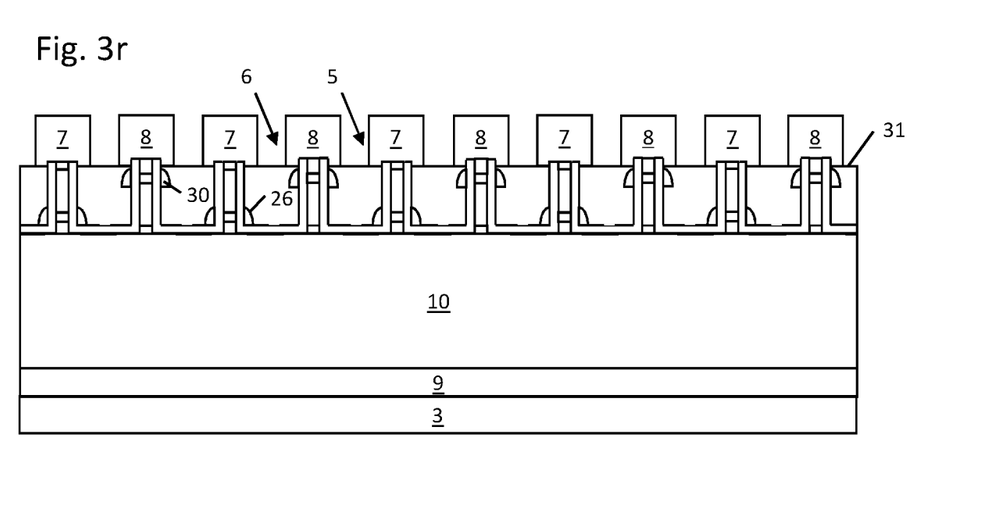

FIGS. 3a to 3r show various stages of manufacturing a power semiconductor device comprising a half-bridge circuit.

In particular, FIG. 3a shows a cross-section through a carrier substrate 9 covered by an epitaxial layer 10. Together, the growth substrate 9 and the epitaxial layer 10 formed on its top surface form a carrier substrate 2.

In the described embodiment, the epitaxial layer 10 may serve as a growth seed for the semiconductor structures selectively grown at a later stage. In this case, the epitaxial layer 10 filters out growth defects. In other embodiments, the epitaxial layer 10 may itself form part of the finished semiconductor device. For example, the epitaxial layer 10 may act as a drift layer. In yet other embodiments, the epitaxial layer 10 may be omitted completely.

On the top surface of the carrier substrate 2, a sacrificial material, for example polycrystalline silicon, has been deposited to form a sacrificial layer 11.

FIG. 3b shows the situation after structuring the sacrificial layer 11. For example, using a corresponding photoresist pattern and conventional etching, a number of sacrificial, vertically orientated nanowires 12 may be formed by removing parts of the sacrificial layer 11. The sacrificial nanowires 12 form positive templates of the semiconductor structures later to be formed.

FIG. 3c shows the situation after covering the sacrificial nanowires 12 with a first dielectric layer 13. For example, $SiO_2$ or $Al_2O_3$ may be deposited on all exposed surfaces of the carrier substrate 2 and the sacrificial nanowires 12 to coat the remaining sacrificial material on all sides.

FIG. 3d shows the situation after a photoresist layer 14 has been applied for planarization. Initially, the photoresist layer 14 covers all of the first dielectric layer 13, such that the sacrificial nanowires 12 are buried in the photoresist material.

FIG. 3e shows the situation after removing an upper part of the photoresist layer 14 to partially expose the upper ends 17 of all sacrificial nanowires 12. This may be achieved, for example, by dry-etching, plasma etching or other known semiconductor processing methods. Attention is drawn to the fact that the sacrificial nanowires 12 are still covered and sealed by the first dielectric layer 13.

FIG. 3f shows the situation after applying and structuring a second dielectric layer 15 to cover the upper ends of a subset of the nanowires 12. In particular, in the example shown in FIG. 3F, every second row of nanowires 12 is covered by the remaining material of the second dielectric layer 15, such as $SiO_2$ or $Al_2O_3$. On the other hand, openings 16 are formed in the second dielectric layer 15 to expose the upper ends 17 of every other nanowires 12. In the described embodiment, the material of the first and second dielectric layers 13 and 15 differ and therefore can be selectively etched using an appropriate agent. Alternatively, the second dielectric layer 15 may be selectively deposited only in those areas corresponding to the covered subset of the nanowires 12.

FIG. 3g shows the situation after removing, e.g. by etching, the topmost part of the first dielectric layer 13 to expose the sacrificial material at the upper ends 17 of a first subgroup of the sacrificial nanowires 12. A different etchant may be used in this step to selective etch the material of the first dielectric layer 13. However, a partial removal of the typically much thicker second dielectric layer 15 is also acceptable.

FIG. 3h shows the situation after removing, e.g. by etching the sacrificial material of the first subgroup of nanowires 17 to form a plurality of first hollow growth templates 18. For example, potassium hydroxide (KOH) or tetra-methyl ammonium hydroxide (TMAH) may be used in a wet etching step to remove exposed Si material forming the nanowires 17. Alternatively XeF2 vapor phase etching may be used on Si materials. Nanowires 17 formed from carbon (C) may be removed, for example, by $O_2$ plasma etching.

FIG. 3i shows the situation after removing the remainder of the second dielectric layer 15 and the photoresist layer 14. It can be seen that the first, open hollow growth templates 18 alternate with remaining sacrificial nanowires 12, whose upper ends 17 are still covered by the first dielectric layer 13, i.e. are closed. Accordingly, when a WBG semiconductor material is applied in a processing chamber, selective growth takes place only in the first hollow growth templates 18.

FIG. 3j shows the situation after selectively growing a first sequence of differently doped WBG semiconductor material in each one of the first plurality of growth templates 18 to form first semiconductor structures 5.

For example, for forming SiC AccuFETs or power MOSFETs, 4H—SiC may be used due to the advantage in 4H—SiC growth technology as well as its attractive electronic properties such as a larger bandgap and higher carrier mobility over other available wafer scale SiC poly types, such as 6H—SiC or 3C—SiC. However, such materials may also be used for selective growth of the semiconductor structures. Attention is drawn to the fact that the crystalline material of the epitaxial layer 10 can act as a growth seed for the selectively grown WBG material, and that the diameter of the hollow growth template 18 can be chosen small enough so as to implement a defect filter.

In the provided example, the entire semiconductor structures 5 may have a diameter in the range of 10 nm to 10 μm, and a length, i.e. in the vertical or normal direction with respect to the tope surface of the carrier substrate 2, of 1 μm to 100 μm. Due to their small size, the semiconductor structures 5 are partially also referred to as nanowire structures in this disclosure. The doping concentration as well as the diameter determine the resistance and current capability of each nanowire, while its length determines its blocking voltage.

In the specific example shown, chemical vapor deposition (CVD) is used to successively deposit first a n+ doped WBG sublayer 19 followed by a p-doped WBG sublayer 20 followed by a n-doped WBG sublayer 21 followed by a n+ doped WBG sublayer 22 of a power MOSFET. However, other types of semiconductor devices, such as AccuFETs may be formed in a similar manner. In the finished device, the p-WBG sublayer 20 acts as a channel or depletion area and the n-WBG sublayer 21 acts as a drift layer of the power MOSFET structure. Attention is also drawn to the fact that essentially the same type of semiconductor structure 5 is grown in parallel in all open, first hollow growth templates 18, while no WBG material is deposited in the closed, still filled sacrificial nanowires 12.

FIG. 3k shows the situation after covering the entire top surface of the device being manufactured with a thin metal layer 23. This may be performed, for example, by atomic layer deposition (ALD) or other suitable processing methods. The material from the metal layer 23 will later be used to form the gate lines and gate spacers for the first semiconductor structures 5 grown previously.

FIG. 3l shows the situation after removing parts of the metal layer 23 in the areas of the remaining sacrificial nanowires 12. For example, a combination of a suitable photoresist mask and selective etching can be employed for this purpose. As a result, first gate lines 24 are formed in the area of the first growth templates 18 only. The gate lines 24 later connect all gates spacers of the first semiconductor structures 5, but are electrically isolated from the second semiconductor structures formed later.

FIG. 3m shows the situation after performing gate metal etching to form first gate structures in the form of bottom gate spacers 26. The gate spacers 26 surround each one of the first semiconductor structures 5 in a cylindrical manner. During this processing step, the metal material of the metal layer 23 remains in the vertical direction only in proximity to the p-WBG sublayer 20, such that the gate spacers 26 can be used as control gates surrounding the channel area of the finished MISFET structures on all sides in a symmetrical fashion.

FIG. 3n shows the situation after depositing a third dielectric layer 27 on the top surface of the device being manufactured. The dielectric layer 27 covers both the first semiconductor structures 5 as well as the remaining sacrificial nanowires 12.

FIG. 3o shows the situation after performing planarization of the device, exposing and opening of the previously closed upper ends 17 and removing of the remaining sacrificial material for the second subset of the originally grown sacrificial nanowires 12. This may be performed in a similar manner as explained above with respect to FIGS. 3e to 3h for the first subset of sacrificial nanowires 12. For example, a further photoresist mask may be applied and planarized in a subsequent lithographic step. Alternatively, a spin-on glass (SOG) layer may be formed. A plurality of second openings 29 is formed in the third dielectric layer 27, exposing the upper ends 17 of a of the sacrificial nanowires 17, before the upper ends 17 are opening and the remaining sacrificial material is removed to form the second hollow growth templates 28. At the same time, the already manufactured first semiconductor structures 5 and associated bottom gate spacers 26 remain covered by the remaining part of the third dielectric layer 27.

FIG. 3p shows the situation after selectively growing second semiconductor structures 6 of a second type in the second hollow growth templates 28 as explained previously with regard to FIG. 3j. However, as shown in FIG. 3p, the sequence of the differently doped WBG semiconductor materials for the second semiconductor structures 6 differs. In the example provided, the sequence of the WBG sublayers 19 to 22 is inverted. That is to say, initially an n+ WBG sublayer 22 is deposited, followed by an n− WBG sublayer 21, a p− WBG sublayer 20 and finally an n+ WBG sublayer 19.

Moreover, as also shown in FIG. 3p, after growing the second semiconductor structures 6, a further metal layer is deposited in the openings 16 surrounding the second hollow growth templates 28. The deposited metal material is etched to form second gate lines (not visible in FIG. 3p) and corresponding second gate structures in the form of top gate spacers 30 surrounding the p− WBG sublayer 20 forming the depletion layer of the created MISFET structure.

FIG. 3q shows the situation after depositing of further dielectric material and its planarization to form a fourth dielectric layer 31. The thickness of the finished dielectric layer 31 corresponds roughly to the length of the first and second semiconductor structures 5 and 6. Accordingly, at this stage, the upper ends of the first semiconductor structures 4 as well as the second semiconductor structures 6 are exposed at the surface of the fourth dielectric layer 31.

FIG. 3r shows the situation after forming metal contacts to electrically contact the respective ends of the grown semiconductor structures 5 and 6. In particular, alternating first and second top side contacts 7 and 8 are formed to contact the upper n+ WBG sublayers 22 of the first semiconductor structures 5 and the upper n+ WBG sublayers 19 of the second semiconductor structures 6, respectively.

Moreover, at the bottom side of the substrate 9, a metal layer is deposited to form a common bottom contact 3 for all semiconductor structures 5 and 6.

Figure 4A:
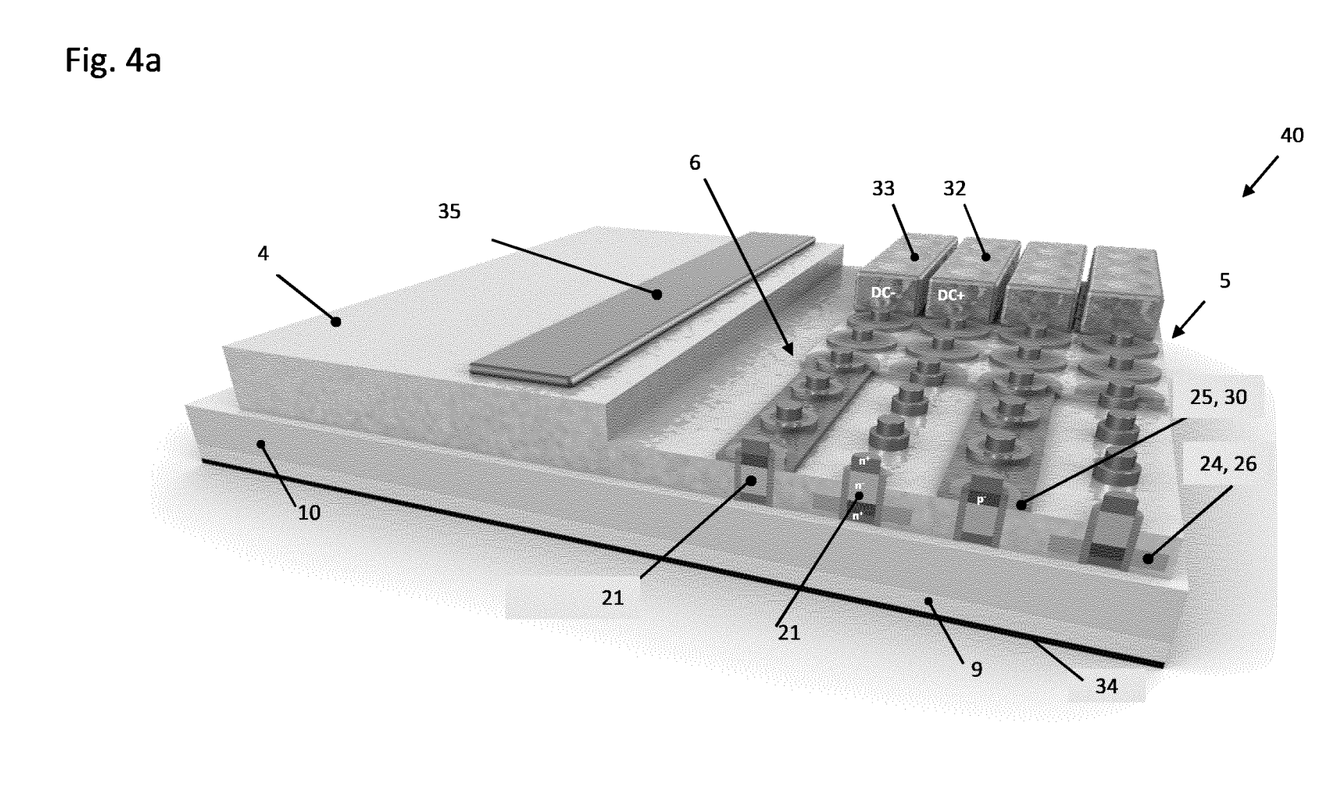
FIGS. 4a and 4b show perspective views of a power semiconductor device and top side contacts for the power semiconductor device, respectively.

FIG. 4a shows a perspective view of a finished power semiconductor device 40 implementing a half-bridge circuit, which may have been manufactured using the method explained above with regard to FIG. 3a to FIG. 3r. Some parts of the semiconductor device 40 have been removed in the view of FIG. 4a to show the internal structure of the finished device.

As can be seen in FIG. 4a, the semiconductor device 40 comprises a two-dimensional array of nanostructures or nanowires formed from WBG material. As can be seen in the partial cross-section in the front row shown in FIG. 4a, the internal structure of the nanostructures embedded in a dielectric layer 4 differs with regard to their respective dopant profiles as explained above. Accordingly, a first group of first semiconductor structures 5 of a first type and a second group of second semiconductor structures 6 of a second type are formed in the dielectric layer 4.

All first semiconductor structures 5 of the first type are connected in parallel using a positive DC (DC+) terminal 32 and an AC terminal 34. Correspondingly, all second semiconductor structures 6 of the second type are connected in parallel using a negative DC (DC−) terminal 33 and the AC terminal 34. It can be seen that respective bottom gate spacers 26 as well as top gate spacers 30 completely surround the respective semiconductor structures 5 and 6, respectively. Moreover, it can be seen that the individual, bottom gate spacers 26 are connected in parallel by metal material forming the first gate lines 24, and that the top gate spacers 30 are connected in parallel by second gate lines 25. Externally, the gate lines 24 and/or 25 are connected to one or more gate runners 35 or gate contacts arranged on an upper surface of the dielectric layer 4.

Figure 4B:
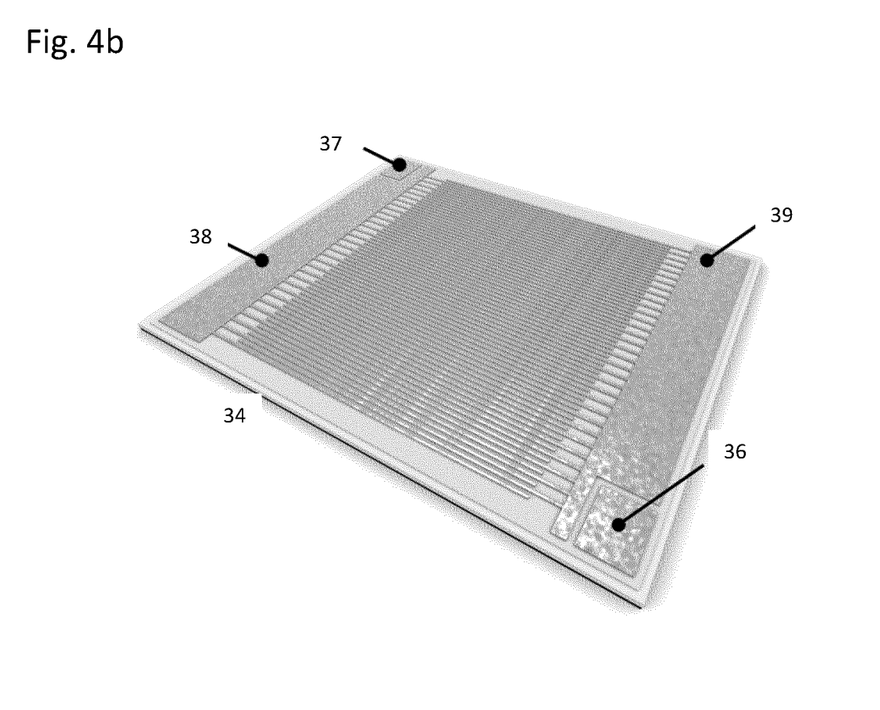

FIG. 4b shows a top side contact structure formed on the upper surface of the dielectric layer 4. A high side gate contact 36 and a low side gate contact 37 are connected to the buried first gate lines 24 of the bottom gate spacers 26 and the second gate lines 25 of the top gate spacers 30, respectively. Moreover, a positive bus bar 38 is connected to all DC+ terminals 32 formed in every second row of the finished array. Correspondingly, a negative bus bar 39 is connected to all DC− terminals 33 in the remaining rows of the array.

The semiconductor devices 1 and 40 as well as the corresponding manufacturing methods described above have a number of advantages over existing power semiconductor structures and manufacturing methods. Among others, the advantageous properties of WBG semiconductor materials, for example the high critical electrical field and electron mobility and/or the possibility of very high frequency switching yield a much larger Baliga figure-of-merit (BFOM) compared to commonly used silicon. This makes such materials a good choice for power switching application and enables several applications for energy transmission and electric transportation.

The specific manufacturing method detailed above allows the fabrication of highly integrated SiC power semiconductor devices in a cost-efficient way. Among others, neither implantation nor activation is needed during the fabrication of the semiconductor devices 1 and 40. Moreover, it enables the use of relatively inexpensive substrates, such as Si or polycrystalline SiC. The manufacturing method has a low thermal budget, which allows for advanced high-K gate dielectric integration. Moreover, the selective forming of two different groups of hollow growth masks 18 and 28 enables the integrated formation of half-bridges or full-bridges in a single design.

Together, the concept of such an integrated SiC half-bridge device allows SiC technology to enter the lower voltage class, for example a voltage class of below 1.2 kV.

The embodiments shown in FIGS. 1 to 4B as stated represent exemplary embodiments of improved power semiconductor devices 1 and 40 and methods for its manufacturing. Therefore, they do not constitute a complete list of all embodiments according to the improved device and manufacturing method. Actual devices and manufacturing methods may vary from the embodiments shown in terms of materials used, specific processing steps and circuit configurations, for example.

REFERENCE SIGNS 1 power semiconductor device
2 carrier substrate
3 bottom contact
4 dielectric layer
5 (first) semiconductor structures
6 (second) semiconductor structures
7 (first) top side contact
8 (second) top side contact
9 substrate
10 epitaxial layer
11 sacrificial layer
12 sacrificial nanowire
13 (first) dielectric layer
14 photoresist layer
15 (second) dielectric layer
16 opening
17 upper end
18 (first) hollow growth template
19 n+ WBG sublayer
20 p− WBG sublayer
21 n− WBG sublayer
22 n+ WBG sublayer
23 metal layer
24 (first) gate line
25 (second) gate line
26 (bottom) gate spacer
27 (third) dielectric layer
28 (second) hollow growth template
29 (second) opening
30 (top) gate spacer
31 (fourth) dielectric layer
32 DC+ terminal
33 DC− terminal
34 AC terminal
35 gate runner
36 (high side) gate contact
37 (low side) gate contact
38 positive bus bar
39 negative bus bar
40 power semiconductor device (with half-bridge circuit)

The invention claimed is:

1. A manufacturing method for a power semiconductor device, comprising:
   forming multiple growth templates on a carrier substrate, comprising at least a first plurality of hollow growth templates and a second plurality of hollow growth templates;
   selectively growing a first sequence of differently doped wide bandgap, WBG, semiconductor material in each one of the first hollow growth templates, thereby forming a corresponding plurality of first semiconductor structures of a first type;
forming a plurality of first gate structures, each one of the first gate structures surrounding at least a channel area of a corresponding one of the plurality of first semiconductor structures;
forming at least one dielectric layer, wherein the first gate structures are buried in the at least one dielectric layer;
selectively growing a second sequence of differently doped WBG semiconductor material in each one of the second hollow growth templates, wherein the second sequence differs from the first sequence, thereby forming a corresponding plurality of second semiconductor structures of a different, second type; and
forming a plurality of second gate structures, each one of the second gate structures surrounding at least a channel area of a corresponding one of the plurality of second semiconductor structures, wherein the second gate structures are formed at closer to an upper surface of the at least one dielectric layer than the first gate structures, such that the first gate structures and the second gate structures vertically offset with respect to each other, wherein the plurality of first semiconductor structures are connected in parallel to allow for an increase in current density, and wherein the plurality of first semiconductor structures of the first type and the plurality of second semiconductor structures of the second type are connected in sequence to form a half-bridge.

2. The method of claim 1, wherein in the step of forming multiple growth templates, an array of vertically oriented growth templates is formed, wherein each one of the vertically oriented growth templates extends in a direction perpendicular to a main surface of the carrier substrate.

3. The method of claim 1, wherein the step of forming multiple growth templates comprises:
depositing and structuring a sacrificial material, in particular amorphous silicon, on the carrier substrate;
covering the structured sacrificial material with a layer of dielectric material; and
selectively removing the sacrificial material surrounded by the dielectric material to form the first and second plurality of hollow growth templates.

4. The method of claim 1, wherein initially upper ends of the multiple growth templates are sealed, and the method further comprises:
before growing the first sequence of differently doped WBG semiconductor material, opening only the upper ends of a first subset of the first plurality of hollow multiple growth templates;
after growing the first sequence of differently doped WBG semiconductor materials, re-sealing the upper ends of the first subset; and
before growing the second sequence of differently doped WBG semiconductor material, opening only the upper ends a second subset of the second plurality of growth templates.

5. The method of claim 1, wherein the first and second sequence of differently doped WBG semiconductor material is selectively grown by chemical vapor deposition, CVD, using different dopant profiles.

6. The method of claim 1, wherein the first hollow growth templates and/or the second hollow growth templates extend to a crystalline material of the carrier substrate, and, in steps of selectively growing, the crystalline material acts as a seed area for the WBG semiconductor material.

7. The method of claim 1, wherein:
in the step of selectively growing the first sequence of differently doped WBG semiconductor material in each one of the first hollow growth templates, a corresponding plurality of n+/p−/n−/n+ semiconductor structures is formed from bottom to top starting from the carrier substrate; and
in the step of selectively growing the second sequence of differently doped WBG semiconductor material in each one of the second hollow growth templates, a corresponding plurality of n+/n−/p−/n+ semiconductor structures is formed from bottom to top starting from the carrier substrate.

8. The method of claim 1, further comprising:
forming a first top side contact, in particular a positive DC terminal of a half-bridge structure, electrically connected to at least a subgroup of the plurality of first semiconductor structures;
forming a second top side contact, in particular a negative DC terminal of a half-bridge structure, electrically connected to at least a subgroup of the plurality of second semiconductor structures; and/or
forming a bottom contact, in particular an AC terminal of a half-bridge structure, electrically connected to at least a subgroup of the plurality of first semiconductor structures and a subgroup of the plurality of second semiconductor structures.

9. A power semiconductor device, comprising:
a carrier substrate comprising at least one bottom contact;
at least one dielectric layer formed on the carrier substrate;
a plurality of first semiconductor structures of a first type formed within the at least one dielectric layer, each one of the first semiconductor structures electrically connected to the bottom contact and comprising a first sequence of differently doped sublayers of a wide bandgap, WBG, semiconductor material;
a plurality of buried first gate structures arranged within the at least one dielectric layer, each one of the first gate structures surrounding a channel area of a corresponding one of the first semiconductor structures;
a plurality of second semiconductor structures of a different, second type formed within the at least one dielectric layer, each one of the second semiconductor structures electrically connected to the bottom contact and comprising a second sequence of differently doped sublayers of the WBG semiconductor material, wherein the second sequence differs from the first sequence;
a plurality of second gate structures arranged at closer to an upper surface of the at least one dielectric layer than the first gate structures, each one of the second gate structures surrounding a channel area of a corresponding one of the second semiconductor structures, wherein the first gate structures and the second gate structures are vertically offset with respect to each other,
a first top side contact arranged on the upper surface of the at least one dielectric layer, the first top side contact electrically connecting at least a subgroup of the plurality of first semiconductor structures; and
a second top side contact arranged on the upper surface of the at least one dielectric layer, the second top side contact electrically connecting at least a subgroup of the plurality of second semiconductor structures, wherein the first semiconductor structures of the first type are n+/p−/n−/n+ semiconductor structures from bottom to top starting from the carrier substrate, and the second semiconductor structures of the second type are n+/n−/p−/n+ semiconductor structures from bottom to top starting from the carrier substrate.

10. The device of claim 9, wherein:

the at least one dielectric layer comprises an array of vertically oriented growth templates extending in a direction perpendicular to a main surface of the carrier substrate;

the first semiconductor structures are nanowire structures selectively grown in a first subset of the array of vertically oriented growth templates; and the second semiconductor structures are nanowire structures selectively grown in a second subset of the array of vertically oriented growth templates.

11. The device of claim 10, wherein the nanowire structures have a diameter of 10 nm to 10 μm;

the nanowire structures have a length of 1 μm to 100 μm, and/or the at least one dielectric layer has a thickness of 1 μm to 100 μm.

12. The device of claim 9, wherein the carrier substrate comprises a layer made from silicon, Si, and/or polycrystalline silicon carbide, poly-SiC;

the at least one dielectric layer comprises a dioxide, in particular silicon dioxide, SiO2, or aluminum oxide, Al2O3; and/or the WBG semiconductor material comprises silicon carbide, SiC, in particular one of 4H—SiC, 6H—SiC or 3C—SiC.

13. The device of claim 9, wherein:

the plurality of buried first gate structures are configured to form first metal insulator semiconductor field effect transistors, MISFETs, in particular first MOSFETS or AccuFETs; and/or the plurality of second gate structures are configured to form second MISFETs, in particular second MOSFETs or AccuFETs.

14. The device of claim 13, comprising:

a half-bridge circuit, wherein the at least one bottom contact corresponds to an AC terminal of the half-bridge circuit, the first top side contact corresponds to a positive DC terminal of the half-bridge circuit, the second top side contact corresponds to a negative DC terminal of a half-bridge circuit, the buried first gate structures are connected in parallel to a first gate contact to selectively switch a first branch of the half-bridge circuit, in particular a high side of the half-bridge circuit, and the second gate structures are connected in parallel to a second gate contact to selectively switch a second branch of the half-bridge circuit, in particular a low side of the half-bridge circuit; or a full-bridge circuit, wherein the buried gate structures corresponding to a first subset of the first semiconductor structures are connected in parallel to a first gate contact to selectively switch a first branch of the full-bridge circuit, the buried gate structures corresponding to a second subset of the first semiconductor structures are connected in parallel to a second gate contact to selectively switch a second branch of the full-bridge circuit, the second gate structures corresponding to a first subset of the second semiconductor structures are connected in parallel to a third gate contact to selectively switch a third branch of the full-bridge circuit, and the further gate structures corresponding to a second subset of the second semiconductor structures are connected in parallel to a fourth gate contact to selectively switch a fourth branch of the full-bridge circuit.

\* \* \* \* \*